(12) United States Patent
Liu et al.

(10) Patent No.: US 9,202,711 B2
(45) Date of Patent: Dec. 1, 2015

(54) SEMICONDUCTOR-ON-INSULATOR WAFER MANUFACTURING METHOD FOR REDUCING LIGHT POINT DEFECTS AND SURFACE ROUGHNESS

(71) Applicant: SunEdison Inc., St. Peters, MO (US)

(72) Inventors: Qingmin Liu, Glen Carbon, IL (US); Jeffrey L. Libbert, O'Fallon, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 18 days.

(21) Appl. No.: 14/209,083

(22) Filed: Mar. 13, 2014

(65) Prior Publication Data

US 2014/0273405 A1    Sep. 18, 2014

Related U.S. Application Data

(60) Provisional application No. 61/783,928, filed on Mar. 14, 2013.

(51) Int. Cl.
| | |
|---|---|
| H01L 21/324 | (2006.01) |
| H01L 21/762 | (2006.01) |
| H01L 21/322 | (2006.01) |
| H01L 21/302 | (2006.01) |
| H01L 21/3065 | (2006.01) |

(52) U.S. Cl.
CPC .......... *H01L 21/3247* (2013.01); *H01L 21/302* (2013.01); *H01L 21/3065* (2013.01); *H01L 21/3226* (2013.01); *H01L 21/76254* (2013.01)

(58) Field of Classification Search
None
See application file for complete search history.

(56) References Cited

U.S. PATENT DOCUMENTS

| | | | | |
|---|---|---|---|---|
| 5,869,387 | A  * | 2/1999  | Sato et al. | 438/459 |
| 6,403,450 | B1   | 6/2002  | Maleville et al. | |
| 2002/0174828 | A1 * | 11/2002 | Vasat et al. | 117/90 |
| 2004/0060899 | A1 * | 4/2004  | Waldhauer et al. | 216/2 |
| 2005/0014346 | A1 * | 1/2005  | Mitani et al. | 438/459 |
| 2006/0228846 | A1 * | 10/2006 | Endo et al. | 438/197 |
| 2007/0048971 | A1 * | 3/2007  | Endo et al. | 438/459 |
| 2010/0130021 | A1   | 5/2010  | Ries et al. | |

FOREIGN PATENT DOCUMENTS

EP    1045448 A1    10/2000

OTHER PUBLICATIONS

International Search Report and Written Opinion of International Application No. PCT/US2014/027418 (Jun. 2, 2014) (9 pages).

* cited by examiner

*Primary Examiner* — Scott B Geyer
(74) *Attorney, Agent, or Firm* — Armstrong Teasdale LLP

(57) ABSTRACT

A method for reducing light point defects of a semiconductor-on-insulator structure and a method for reducing the surface roughness of a semiconductor-on-insulator structure are disclosed. The methods can include a combination of thermally annealing the structure followed by a non-contact smoothing process.

20 Claims, 6 Drawing Sheets

SEMICONDUCTOR-ON-INSULATOR WAFER MANUFACTURING METHOD FOR REDUCING LIGHT POINT DEFECTS AND SURFACE ROUGHNESS

CROSS-REFERENCE TO RELATED APPLICATION

This application claims priority to U.S. Provisional Application Ser. No. 61/783,928, filed on Mar. 14, 2013, the entire content of which is incorporated herein by reference.

FIELD

This disclosure relates generally to a method for reducing light point defects of a semiconductor-on-insulator structure and a method for reducing the surface roughness of a semiconductor-on-insulator structure. The methods include a combination of thermally annealing the structure followed by a non-contact smoothing process.

BACKGROUND

Semiconductor wafers are generally prepared from a single crystal ingot (e.g., a silicon ingot) which is then sliced into individual wafers. In some applications, a multi-layered structure (sometimes generically referred to as a multi-layered structure or simply as a wafer) may be used. A common form of multi-layered structure is a semiconductor on insulator structure, one of the most common of which is a silicon-on-insulator (SOI) wafer. An SOI wafer typically includes a thin layer of silicon atop a dielectric layer (i.e., an insulating layer) which is in turn disposed on a substrate (i.e., a handle wafer). Typically the substrate or handle wafer is silicon.

In some approaches, a process for making a semiconductor on insulator wafer may include implanting particles (e.g., hydrogen atoms or a combination of hydrogen and helium atoms) at a specified depth beneath the front surface of a donor wafer. The implanted particles form a damage layer which may be or become a cleave plane in the donor wafer at the specified depth at or near the depth at which they were implanted. The surface of the donor wafer may be cleaned to remove material deposited on the wafer during the implantation process. The donor may then be bonded to a handle wafer and the bonded structure. In some approaches the donor wafer and/or the handle wafer may have a dielectric layer deposited on the surface prior to or after the implantation, but prior to bonding. The donor and handle may then be bonded such that the dielectric layer becomes sandwiched between the donor and the handle. The donor may thereafter be cleaved to form a semiconductor-on-insulator structure. If no dielectric later is present, the structure formed would be a semiconductor-on-substrate, such as silicon germanium on silicon or even silicon on silicon. In instances where the donor is a silicon wafer and the dielectric layer is an insulator such as silicon dioxide, the structure formed would be an SOI wafer.

Typically, the assembly of such structures may include an annealing process performed in environments (such as nitrogen or oxygen) that do not significantly improve the surface morphology. For example, oxidation and/or nitridation of a silicon surface prevents the surface from getting smoother during the annealing process. Moreover, since the surface during the anneal is damaged, a low oxidation rate must be used to avoid creating secondary defects in the SOI layer. One consequence of the low oxidation rate is that the damage layer existing at the top surface of the SOI film is not removed during the anneal. During a final thermal step used to smooth and thin the SOI to a target thickness, the residual damage can be preferentially etched so as to form small features on the completed surface. The surface features can scatter light during an inspection with a standard laser based surface inspection tool resulting in a high background noise level.

As a result, current manufacturing processes can result in haze-related patterns when inspecting the final product. One type of haze-related pattern is the "hour-glass" pattern, which can result from surface roughness (e.g., see FIG. 2). Another source of noise results from the interaction of the final smoothing process with very small, benign, bulk inhomogeneities in the SOI film, which form very shallow but detectable features during automated surface inspection using laser scattering methods. These types of haze-related patterns typically occur in a ring or central light point defect patterns such as is seen in FIG. 3.

These haze-related patterns lead to decreased performance of the final wafer product via implant damage, surface roughness and light point defects (LPDs). There remains an unfulfilled need, therefore, for processing SOI structures to reduce any resulting LPD defects and to reduce any surface roughness in order to avoid haze-related patterns.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In a one aspect, a method for processing a layered structure is disclosed. The surface of the layered structure typically comprises silicon and/or silicon germanium. The surface of the layered structure is processed by thermally annealing the structure in an environment comprising a gas selected from the group consisting of argon, hydrogen, helium and mixtures thereof at a temperature of at least about 950° C., wherein the environment contains less than about 10 ppm of oxygen, and then performing a non-contact smoothing process on the cleaved surface.

In another aspect, a method for processing a silicon-on-insulator structure is disclosed. The SOI structure comprises a handle wafer, a silicon layer, and a dielectric layer between the handle wafer and the silicon layer. The silicon layer has a cleaved surface defining an outer surface of the structure. The method comprises the steps of thermally annealing the structure in an environment comprising a gas selected from the group consisting of argon, hydrogen, helium and mixtures thereof at a temperature of at least about 950° C., wherein the environment contains less than about 10 ppm of oxygen, and then performing a non-contact smoothing process on the cleaved surface.

In another aspect, a method for reducing light point defects of a SOI structure is disclosed. The SOI structure comprises a handle wafer, a silicon layer, and a dielectric layer between the handle wafer and the silicon layer. The silicon layer has a cleaved surface defining an outer surface of the structure. The method comprises the steps of thermally annealing the structure in an environment comprising a gas selected from the group consisting of argon, hydrogen, helium and mixtures thereof at a temperature of at least about 950° C., wherein the environment contains less than about 10 ppm of oxygen, and then performing a non-contact smoothing process on the cleaved surface.

In yet another aspect, a method for reducing the surface roughness of a SOI structure is disclosed. The SOI structure comprises a handle wafer, a silicon layer, and a dielectric layer between the handle wafer and the silicon layer. The silicon layer has a cleaved surface defining an outer surface of the structure. The method comprises the steps of thermally annealing the structure in an environment comprising a gas selected from the group consisting of argon, hydrogen, helium and mixtures thereof at a temperature of at least about 950° C., wherein the environment contains less than about 10 ppm of oxygen, and then performing a non-contact smoothing process on the cleaved surface.

In yet another aspect, a method for processing a SOI structure is disclosed. The SOI structure comprises a handle wafer, a silicon layer, and a dielectric layer between the handle wafer and the silicon layer. The silicon layer has a cleaved surface defining an outer surface of the structure. The method comprises the steps of thermally annealing the structure in a pure argon environment at a temperature of at least about 950° C., wherein the environment contains less than about 10 ppm of oxygen, and then performing a non-contact smoothing process on the cleaved surface.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION OF THE INVENTION

The present disclosure is directed to methods for processing an SOI structure, methods for reducing LPDs of an SOI structure, and methods for reducing the surface roughness of an SOI structure. The exemplary methods disclosed herein utilize a combination of thermally annealing the SOI structure and then performing a non-contact smoothing process on the SOI structure. As a result, the inventors have discovered a way to achieve an SOI structure with reduced surface roughness and reduced LPDs.

Semiconductor-On-Insulator Structure

Figure 1:
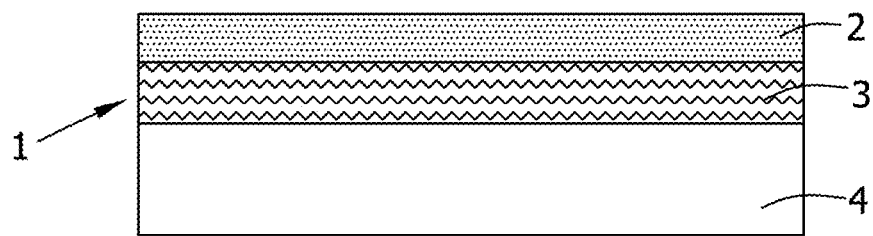
FIG. 1 is a SOI structure suitable for use in accordance with embodiments of the present disclosure.
Figure 2:
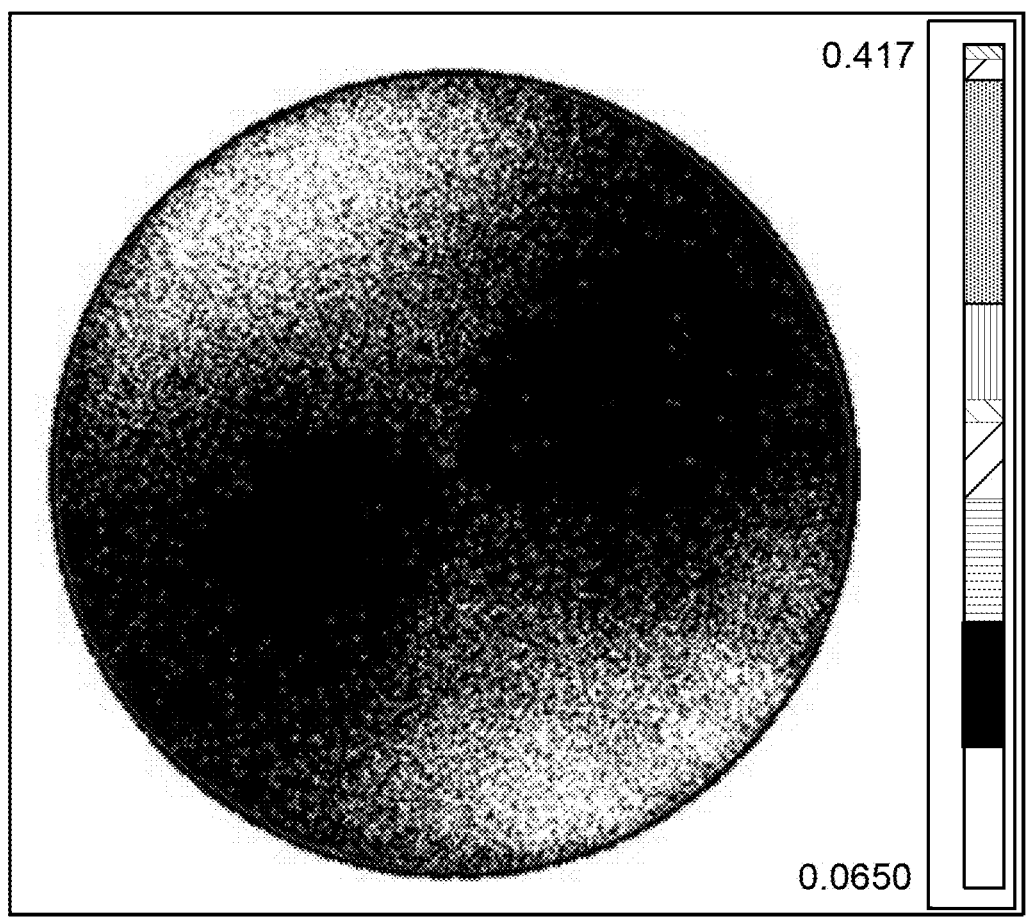
FIG. 2 is an exemplary 65 nm LPD inspection particle map showing an "hour-glass" haze pattern.
Figure 3:
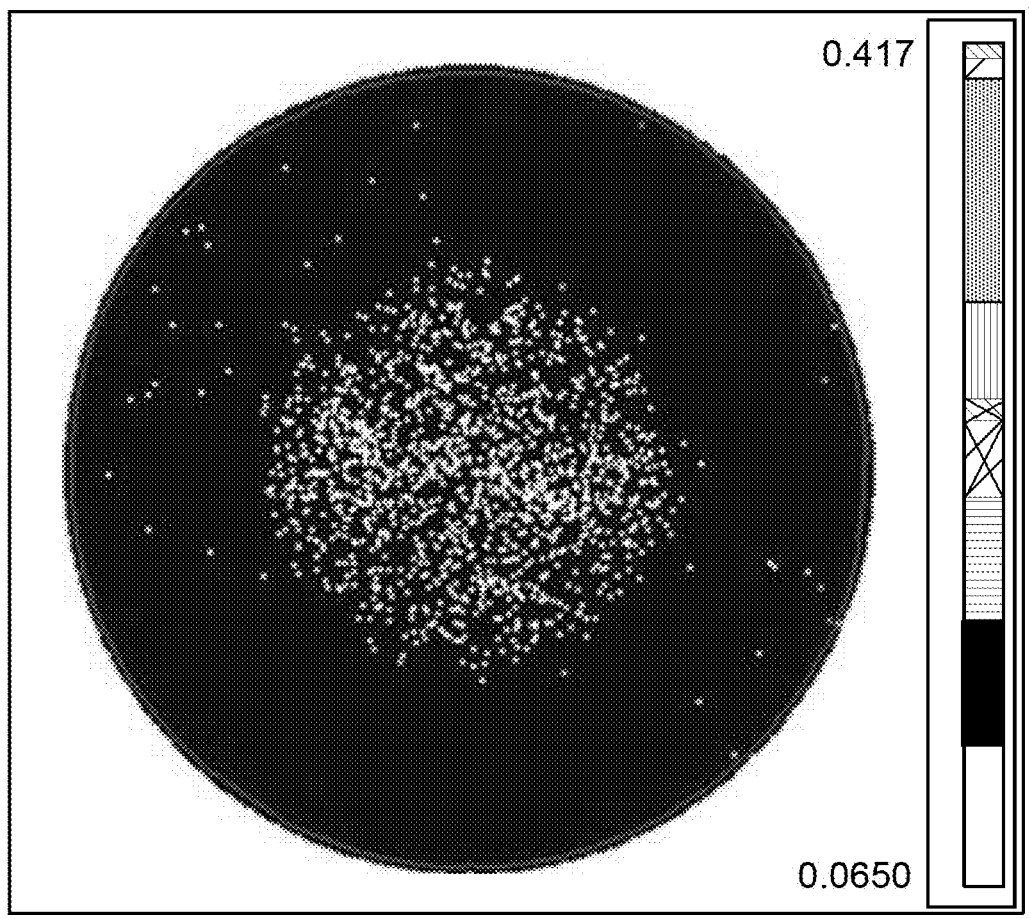
FIG. 3 is an exemplary 65 nm LPD inspection particle map showing a pattern resulting from decoration of small bulk inhomogeneities.

A semiconductor layered structure suitable for use in embodiments of the present disclosure is generally referenced by numeral 1 in FIG. 1. It should be noted that the semiconductor portion 2 of the structure is generally the portion upon or in which microelectronic devices are formed. One typical semiconductor layer 2 (also referred to as a device layer) utilized in the present application is silicon or silicon germanium, however other semiconductor layers or multiple layers including material such as, for example, silicon, germanium, gallium arsenide, aluminum nitride, silicon germanium, gallium nitride, may be used as described below without departing from the scope of the present application. For exemplary purposes, the following discussion may refer to silicon as the semiconductor layer. The substrate 4 (also referred to as a handle wafer) may be any material suitable for forming a layered structure (e.g., silicon, germanium, gallium arsenide, aluminum nitride, silicon germanium, gallium nitride, sapphire and combinations thereof). In various embodiments, the layered semiconductor structure also includes a dielectric layer 3 disposed between the semiconductor layer 2 and the handle wafer 4.

The dielectric layer 3 (also referred to as an insulating layer) may be any electrically insulating material suitable for use in a semiconductor-on-insulator structure, such as a material comprising $SiO_2$, $Si_3N_4$, aluminum oxide, or magnesium oxide or combinations thereof. Typically, an SOI structure comprises an insulating layer such as $SiO_2$ in part or in whole as the insulating layer.

SOI structures and methods for producing them are generally known by those skilled in the art (see, for example, U.S. Pat. Nos. 5,189,500; 5,436,175; and, 6,790,747, each of which is incorporated herein for all relevant and consistent purposes). It should be noted that the SOI structure may be bonded through any means generally known in the art, including oxidation and/or surface activation. For example, in some embodiments the SOI structure may be bonded through oxidation of the donor wafer, the handle wafer, or both the donor wafer and the handle wafer prior to bonding. In other embodiments, the SOI structure may be bonded by surface activation with dielectric layers on the donor wafer, the handle wafer, or both the donor wafer and the handle wafer.

An exemplary process of making a SOI structure includes depositing a dielectric layer (e.g., an oxide layer) on a polished front surface of a donor wafer. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned in one or more cleaning operations to remove contaminants (e.g., organic compounds and other contaminant particles) deposited on the wafer during the implantation process.

The front surface of the donor wafer is then bonded to a handle wafer to form a bonded wafer through, for example, a hydrophilic bonding process. In some embodiments, the donor wafer and handle wafer are bonded together by exposing the surfaces of the wafers to a plasma, which modifies the structure of the surfaces in a process often referred to as surface activation. The wafers are then pressed together and a bond is formed therebetween. This bond is typically relatively weak, and may therefore be strengthened prior to cleaving the structure to remove a portion of the donor wafer.

In some processes, the hydrophilic bond between the donor wafer and handle wafer (i.e., a bonded wafer) is strengthened by heating or annealing the bonded wafer pair, to form covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane. A portion of the donor wafer is then separated (i.e., cleaved) along the cleave plane from the bonded wafer to form the SOI structure.

In some embodiments, the ion implantation dosage may be sufficient that in combination with the annealing step the bond is sufficiently strengthened and the cleave plane is sufficiently weakened to allow thermal cleavage along the cleave plane. It should be noted in this regard that layer transfer processes using a thermal cleaving process are generally known to the skilled person and may be utilized to implant, bond and separate the structure without departing from the scope of the present application.

Typically, the dosage and anneal are such that the bond is strengthened and the cleave plane weakened without thermal cleavage occurring and the structure is mechanically cleaved in a subsequent or concurrent step. Like the thermal cleaving processes referred to above, layer transfer processes utilizing a mechanical cleave to separate the structure after implantation and bonding are generally know to the skilled person and may be utilized to implant, bond and separate the structure without departing from the scope of the present application.

Typically, the bonded structure is first placed in a fixture in which mechanical force is applied generally perpendicular to the opposing sides of the bonded wafer in order to pull a portion of the donor wafer apart from the bonded wafer. It should be noted that the opposing forces need not be perfectly perpendicular to the opposing sides without departing from the scope of the present application. According to some embodiments, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming a SOI structure. According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer.

The resulting SOI structure comprises a thin layer of silicon 2 (the portion of the donor wafer remaining after cleaving) disposed atop the dielectric layer 3 and the handle wafer 4. The cleaved surface of the SOI structure (i.e., the thin layer of silicon of the donor wafer) has a rough surface that may be smoothed by additional processing.

In some embodiments of the present disclosure, the SOI structure that is exposed to the semiconductor process has a silicon layer with a thickness of from about 100 Å to about 5,000 Å, preferably from about 1,000 Å to about 2,000 Å. It should be understood, however, that other thicknesses may be used without departing from the scope of the present disclosure. Optionally, the silicon layer may contain materials other than silicon such as carbon or germanium.

As noted elsewhere throughout this disclosure, the dielectric layer 3 may be any electrically insulating material suitable for use in a SOI structure, such as a material comprising $SiO_2$, $Si_3N_4$, aluminum oxide, or magnesium oxide. In some embodiments, the dielectric layer is $SiO_2$ (i.e., the dielectric layer consists essentially of $SiO_2$). $SiO_2$ containing dielectric layers may suitably be more readily etched relative to other materials which may form the dielectric layer. However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide. The dielectric layer is typically less than about 500 nm thick and, in certain embodiments, is less than about 300 nm thick, less than 200 nm thick, less than about 150 nm thick, or less than about 10 nm thick.

Thermally Annealing

In accordance with the present disclosure, the SOI structure formed by the layer transfer process is thermally annealed after cleaving. The thermal annealing of the SOI structure functions to reduce the surface roughness of the silicon layer, densify the dielectric layer and strengthen the bond between the silicon layer and the dielectric layer.

In some known SOI manufacturing processes, annealing processes subsequent to the separation are performed in a mixture of oxygen and nitrogen gaseous environment. When this type of environment is used, however, the oxidation and/or nitridation of the surface of the silicon layer prevents the silicon layer from smoothing during the annealing process. Alternatively, it is preferred to thermally anneal the SOI structure in a different environment than those customarily used in the art.

In some embodiments of the present disclosure, the structure is thermally annealed in the presence of at least one inert gas. As used herein, an "inert gas" is a gas that is non-reactive with respect to silicon. Suitable inert gases include, but are not limited to, the noble gases. It should be noted, however that while hydrogen is not considered an inert gas with respect to silicon since it may cause slight etching on the surface of the wafer, it is also a suitable atmosphere for the annealing processes of embodiments of the present disclosure in addition to or as an alternative to the inert gases. That is, the atmosphere may include hydrogen, mixtures of hydrogen and one or more inert gases, an inert gas or mixtures of only inert gases according to any percentage by volume of hydrogen and/or inert gases.

In some embodiments, for example, the annealing atmosphere may include from about 0% to about 100% by volume of argon. In other embodiments, the annealing atmosphere may include from about 0% to about 100% by volume of hydrogen. In certain embodiments, the annealing atmosphere may include about 80% by volume argon and about 20% by volume hydrogen. In other certain embodiments, the annealing atmosphere may include about 80% by volume hydrogen and about 20% by volume argon. In yet other preferred embodiments, the annealing atmosphere may include from about 95-97% by volume argon and from about 3-5% by volume hydrogen. In still other embodiments, the annealing atmosphere may include from about 0% to about 100% by volume of helium.

In an exemplary embodiment of the present disclosure, the SOI structure is thermally annealed in an environment comprising a gas selected from the group consisting of argon, hydrogen, helium and mixtures thereof. Typically, but without limitation, the wafer is annealed in an atmosphere comprising argon for a variety of benefits, including minimizing operating cost. Further, the argon environment helps to preserve the resistivity of the layer. In preferred embodiments, the structure is annealed in a substantially pure argon environment. A substantially pure argon environment is one that contains less than about 1 ppm of oxygen and/or less than about 1 ppm of water vapor. That is, in a pure argon environment, argon is the only gaseous element present except for any trace amounts (i.e., less than about 1 ppm) of a different gas that may incidentally be present due to reaction conditions. The wafer may be annealed, however, in other atmospheres without departing from the scope of this embodiment.

In all embodiments, it should be noted that the amount of oxygen in the environment is less than about 10 ppm. That is, even though the environment may comprise a gas selected from the group consisting of argon, helium, hydrogen, and mixtures thereof, there may be trace amounts of oxygen present in the environment. In those circumstances, the environment contains less than about 10 ppm of oxygen, preferably less than about 5 ppm of oxygen, and more preferably less than about 1 ppm of oxygen. Also in those circumstances, the environment may contain less than about 1 ppm of water vapor.

The SOI structure may be maintained in an atmosphere comprising argon, hydrogen, helium or mixtures thereof at a temperature of at least about 950° C. According to preferred embodiments, the structure is annealed at a temperature of from about 1050° C. to about 1200° C.; more preferably at a temperature of from about 1075° C. to about 1150° C.; and even more preferably at a temperature of about 1100° C.

The amount of time the SOI structure is thermally annealed is also important. In some embodiments, the SOI structure is thermally annealed for a period of from about 15 minutes to about 10 hours. Preferably, the structure is thermally annealed for a period of from about 1 to about 4 hours, and more preferably for a period of about 2 hours. In other preferred embodiments, the SOI structure is thermally annealed at a temperature of about 1100° C. for a period of about 2 hours.

The thermal anneal not only reduces surface roughness but also reduces light point defects (LPDs) at the wafer surface caused by scratches, roughness and surface defects. Some embodiments of the present disclosure reduce LPDs at the wafer surface caused by scratches, roughness and surface defects.

In some embodiments, by heating the wafer to a temperature above at least about 950° C., the method disclosed herein reduces light point defects having a diameter of from about 60 nm to about 70 nm to no more than about 150 per structure. In preferred embodiments, the method reduces light point defects having a diameter of about 65 nm to no more than about 50 per structure.

In an exemplary embodiment, the thermal anneal may be performed after the SOI structure has been polished. If a thermally annealed structure is polished, the polishing step may remove the layer of atoms restructured by the thermal anneal and result in an increase in surface roughness at some wavelengths as dependent upon the polishing conditions.

Polishing of SOI structures according to embodiments of the present disclosure may be achieved using any polishing method known to those skilled in the art for reducing roughness and, for example, may be achieved by chemical-mechanical planarization (CMP). CMP typically involves the immersion of the SOI structure in an abrasive slurry and polishing of the structure by a polymeric pad. Through a combination of chemical and mechanical means the surface of the structure is smoothed. Typically the polish is performed until a chemical and thermal steady state is achieved and until the structures have achieved their targeted shape and flatness.

According to embodiments of the present disclosure, the thermal annealing may be done in a conventional rapid thermal anneal (RTA) process, a batch anneal process, or other suitable annealing processes. In preferred embodiments, the annealing is a batch anneal process.

Non-Contact Smoothing Process

The thermal annealing according to the present disclosure dissolves any small oxygen precipitates due to oxygen out-diffusion and the surface is smoothed as result of the silicon surface diffusion. Though this annealing step is beneficial, the thermal anneal may not eliminate all potential 65 nm haze-related patterns in the SOI structures. Thus, the present disclosure contains a second, further smoothing step referred to as a non-contact smoothing process. This process not only further reduces the surface roughness of the SOI structure but also removes any implant damage that was not completely healed in the thermal anneal.

The additional smoothing step produces an SOI structure with much improved surface roughness compared to current products. Additionally, the combination smoothing process disclosed herein produces no haze-related patterns on the resulting SOI structures. As a result, the two-step thermal anneal and non-contact smoothing process produces a much smoother SOI structure surface than current smoothing processes.

In some embodiments of the present disclosure, the non-contact smoothing process performed on the cleaved surface of the SOI structure comprises an epi-smoothing process (i.e., epitaxial smoothing or "etching"). An exemplary epi-smoothing process is described as follows.

The epi-smoothing method begins with the insertion of the SOI structure into a reactor. The SOI structure may be inserted into the reactor by any suitable device, such as a robotic manipulator. The reactor may be any suitable epitaxial deposition and/or smoothing reactor suitable for performing the epi-smoothing process upon SOI structures. The reactor typically has one or more lamps or other mechanisms to heat the interior of the reactor.

The temperature within the reactor is then set such that the etching reaction will be kinetically limited, as opposed to being transport limited. As described above, by setting and controlling the temperature such that the epi-smoothing reaction will be kinetically limited results in a more uniform thickness over the cleaved surface of the SOI structure. When the rate of reaction is kinetically limited, the difference in the rate from the center of the SOI structure to the outer edge is reduced. Instead of increasing at the edges of the SOI structure, the rate of reaction is relatively uniform across the surface of the SOI structure. According to some embodiments, the temperature at which the etching reaction is kinetically limited is between 900° C. and 1050° C.

Next, the flow of gaseous etchant into the reactor is initiated. According to some embodiments, the flow of gaseous etchant is initiated immediately after the SOI structure is inserted in the reactor. In these embodiments, the temperature of the reactor is already set at the proper temperature to ensure that the etching reaction will be kinetically limited. The gaseous etchant may be a mixture of HCl or chlorine and $H_2$, according to some embodiments.

The flow of gaseous etchant into the reactor then continues for a period of time. The length of the period of time may be determined based on the amount of silicon that is to be removed from the cleaved surface of the SOI structure and the rate at which the silicon is being etched. For example, if the rate of etching is 3.0 Angstroms/sec and the amount of silicon to be removed is 900 Angstroms, then the SOI structure will be removed from the reactor 300 seconds after the flow of gaseous etchant was initiated.

The flow of gaseous etchant is then stopped after the desired amount of silicon has been removed by the flow of gaseous etchant. The SOI structure is then removed from the reactor. In some embodiments, the SOI structure may be removed from the reactor by a robotic transport system. In other embodiments, the SOI structure may remain in the reactor and be subjected to an epi-deposition process in the same reactor.

After employing the thermal annealing of the present disclosure, the Roughness Measurement System (RMS) surface roughness of the SOI structure is between about 0.2 nm and about 0.3 nm as measured with scan sizes of about 1 μm×about 1 μm to about 30 μm×about 30 μm. The non-contact smoothing process of the present disclosure is able to further reduce the surface roughness of the surface of the SOI structure to below about 0.2 nm as measured with scan sizes of about 1 μm×about 1 μm to about 30 μm×about 30 μm.

The following examples are illustrative and are not intended to limit the scope of the disclosure.

EXAMPLES

Example 1

Several SOI structures according to the method described below were prepared. The structures had a cleaved surface, a thin layer of silicon on top of a dielectric oxide layer and a handle wafer. The test wafers were processed through a SOI manufacturing line up to a pre-epi-smoothing-annealing (PESA) step using a Process of Record (POR) manufacturing process.

The wafers were then processed through thermal annealing in an environment comprising argon in an ASM A412 vertical furnace. The wafers were annealed at 1075° C. for 2 hours in a pure argon environment. Next, the test wafers were processed through an ASM E3000 epi-reactor using the epi-smoothing process used for SOI production wafers according to the epi-smoothing process of the present disclosure.

Figure 4:
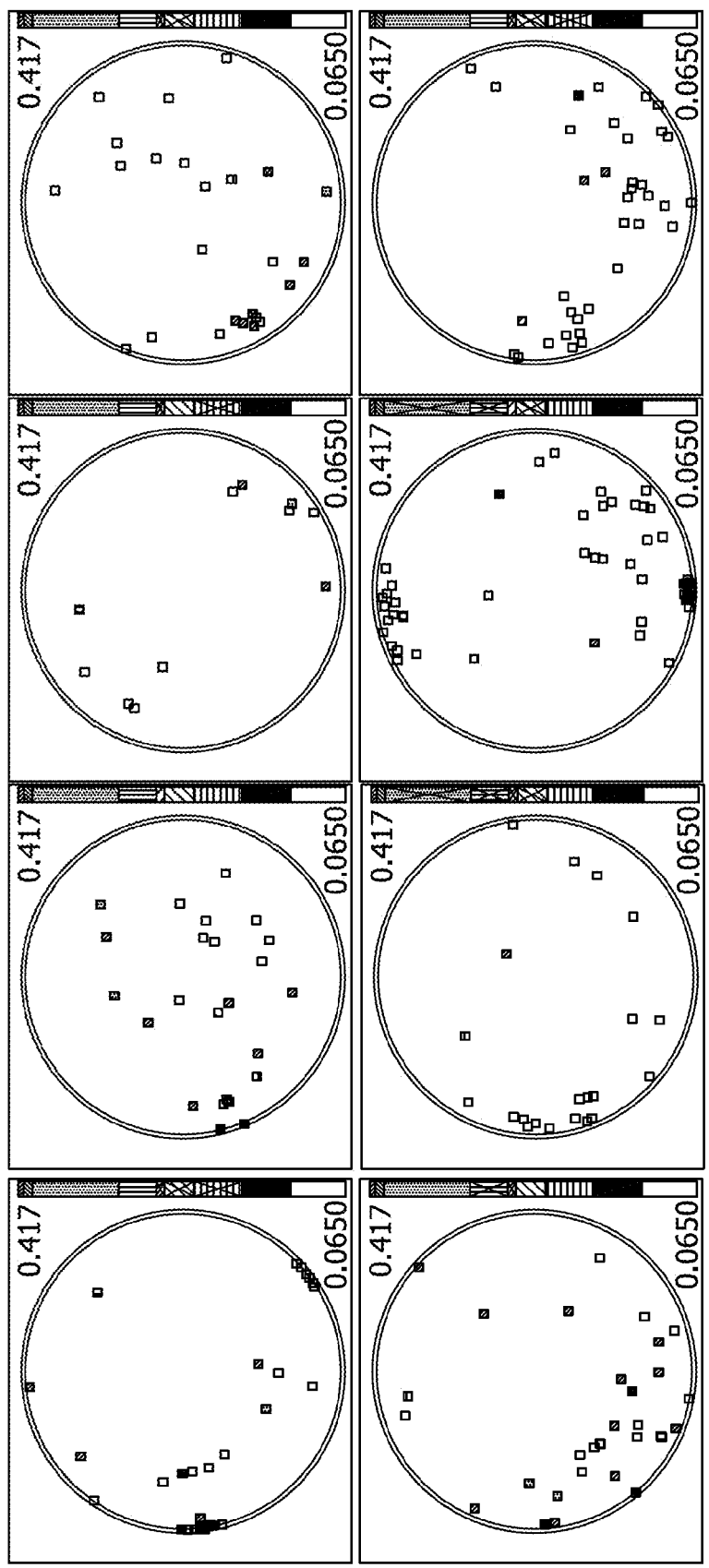
FIG. 4 depicts exemplary 65 nm LPD inspections on test wafers in accordance with the present disclosure.

After the non-contact smoothing process, the test wafers were inspected for 65 nm LPDs. The inspection results are disclosed in FIG. 4. As can be seen in FIG. 4, the previously defect-causing "hour glass" and precipitation haze-related patterns are not present in test SOI wafers.

Figure 5:
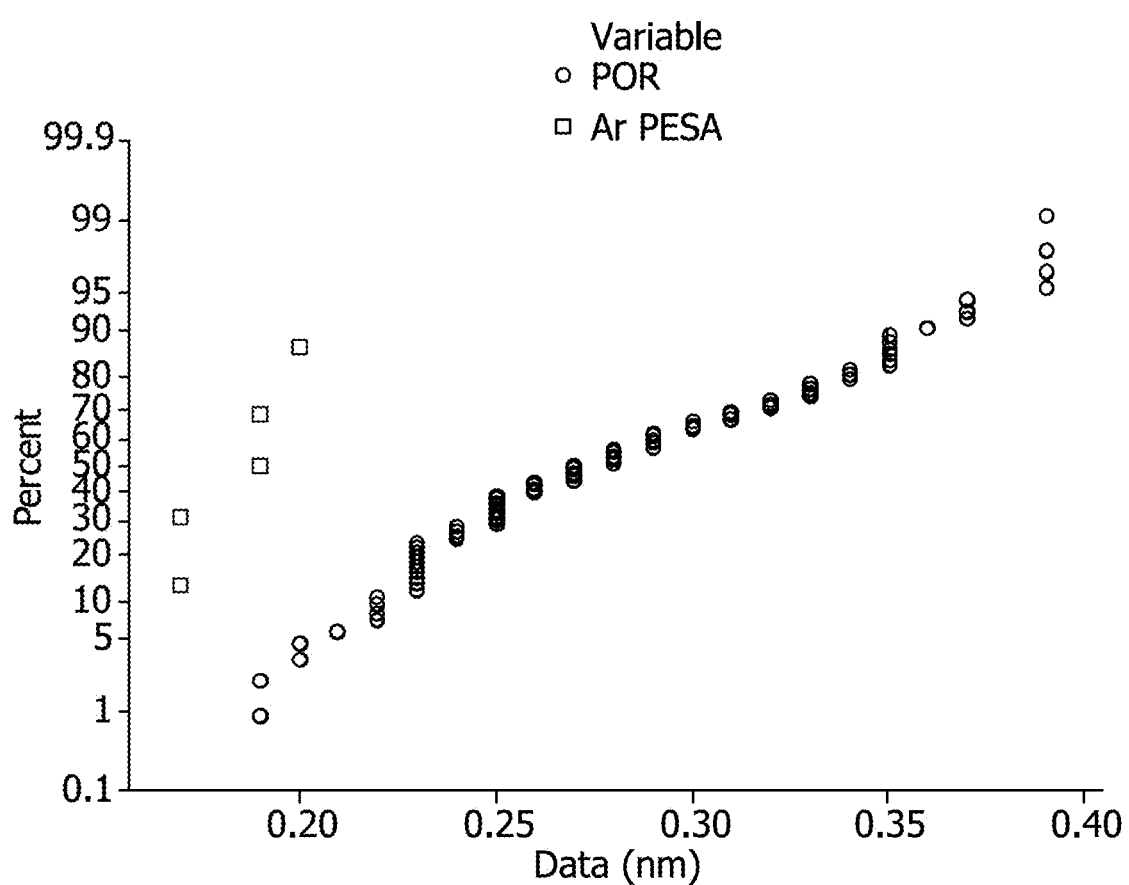
FIG. 5 is a probability plot of the measured surface roughness of test wafers over a scan area of 30 μm×30 μm.

FIG. 5 displays the measured AFM surface roughness of the test wafers as compared to the measured AFM surface roughness of standard production wafers. As can be seen in FIG. 5, the wafers processed through the method of Example 1 have much better surface roughness performance (i.e., smoother surfaces), including surface roughness measurements below about 0.20 nm as measured over a scan area of 30 μm×30 μm.

Thus, Example 1 provides evidence that the exemplary thermal annealing process heals the cleaved surface by silicon surface self-diffusion and the subsequent epi-smoothing process further reduces the surface roughness and heals any remaining implant damage.

Example 2

Figure 6A:
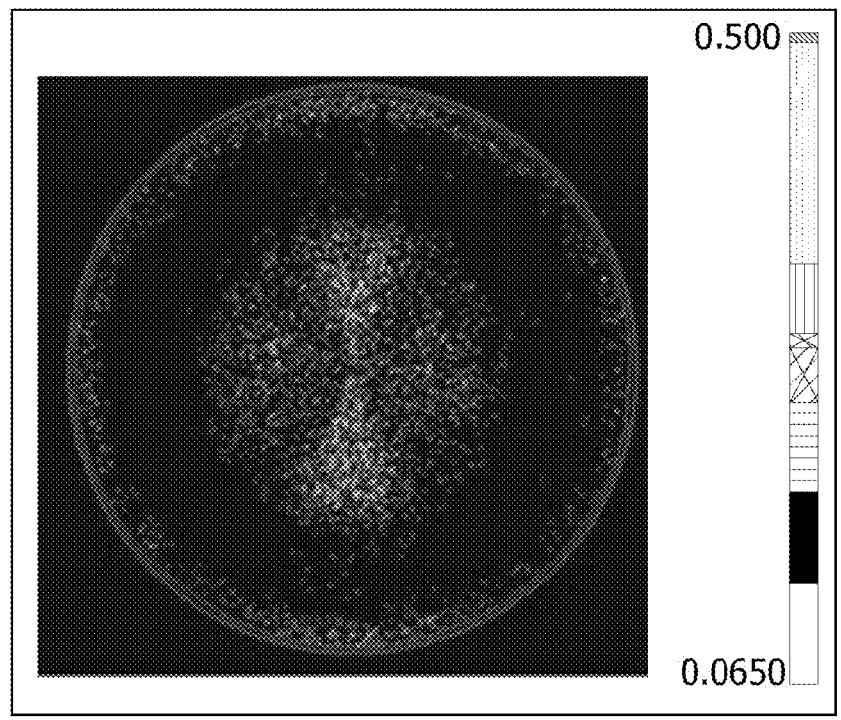
FIG. 6A is a 65 nm LPD inspection particle map on a wafer processed through a POR process.
Figure 6B:
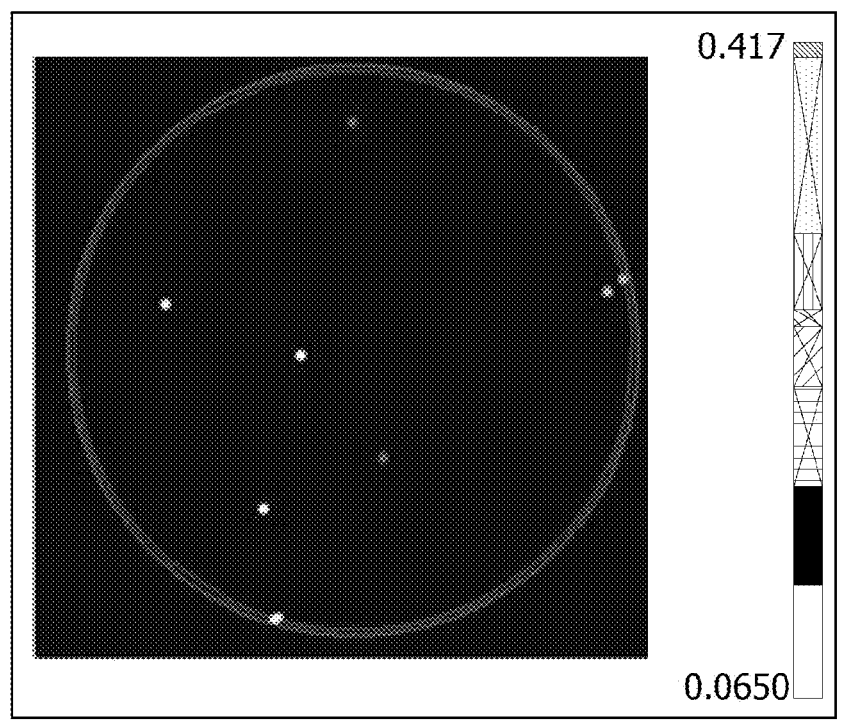
FIG. 6B is a 65 nm LPD inspection particle map on a wafer processed through the processes in accordance with the present disclosure.

Two sister SOI wafers from the same crystal section were prepared in Example 2. The first SOI wafer was processed through a standard POR process. The second SOI wafer was processed according to the methods and conditions set forth in Example 1. FIG. 6A shows the precipitation haze-related pattern on a SOI wafer prepared according to the standard POR process. FIG. 6B shows the dramatic improvement in the presence of 65 nm LPDs in an SOI wafer produced by the methods of the present disclosure. Thus, the methods of the present disclosure are able to successfully reduce the presence of 65 nm LPDs in an SOI wafer.

When introducing elements of the present disclosure or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the disclosure, it is intended that all matter contained in the above description and shown in the accompanying drawings shall be interpreted as illustrative and not in a limiting sense.

What is claimed is:

1. A method for processing a silicon-on-insulator structure comprising a handle wafer, a silicon layer, and a dielectric layer between the handle wafer and the silicon layer, the silicon layer having a cleaved surface defining an outer surface of the structure, the method comprising the steps of:
    thermally annealing the structure in an environment comprising a gas selected from the group consisting of argon, hydrogen, helium and mixtures thereof at a temperature of at least about 950° C., wherein the environment contains less than about 10 ppm of oxygen; and
    performing a non-contact smoothing process on the cleaved surface.

2. The method of claim 1, wherein the structure is annealed in a pure argon environment.

3. The method of claim 1, wherein the structure is annealed at a temperature of from about 1050° C. to about 1200° C.

4. The method of claim 1, wherein the structure is annealed for a period of from about 15 minutes to about 10 hours.

5. The method of claim 1, wherein the environment contains less than about 1 ppm of water vapor.

6. The method of claim 1, wherein the non-contact smoothing process comprises an epi-smoothing process on the cleaved surface.

7. A method for reducing light point defects of a silicon-on-insulator structure comprising a handle wafer, a silicon layer, and a dielectric layer between the handle wafer and the silicon layer, the silicon layer having a cleaved surface defining an outer surface of the structure, the method comprising:
    thermally annealing the structure in an environment comprising a gas selected from the group consisting of argon, hydrogen, helium and mixtures thereof at a temperature of at least about 950° C., wherein the environment contains less than about 10 ppm of oxygen; and
    performing a non-contact smoothing process on the structure.

8. The method of claim 7, wherein the structure is annealed in a pure argon environment.

9. The method of claim 7, wherein the structure is annealed at a temperature of from about 1050° C. to about 1200° C.

10. The method of claim 7, wherein the structure is annealed for a period of from about 15 minutes to about 10 hours.

11. The method of claim 7, wherein the environment contains less than about 1 ppm of water vapor.

12. The method of claim 7, wherein the non-contact smoothing process comprises an epi-smoothing process on the cleaved surface.

13. The method of claim 7, wherein the method reduces light point defects having a diameter of from about 60 nm to about 70 nm to no more than about 150 per structure.

14. A method for reducing the surface roughness of a silicon-on-insulator structure comprising a handle wafer, a silicon layer, and a dielectric layer between the handle wafer and the silicon layer, the silicon layer having a cleaved surface defining an outer surface of the structure, the method comprising:
    thermally annealing the structure in an environment comprising a gas selected from the group consisting of argon, hydrogen, helium and mixtures thereof at a temperature of at least about 950° C., wherein the environment contains less than about 10 ppm of oxygen; and performing a non-contact smoothing process on the structure.

15. The method of claim 14, wherein the structure is annealed in a pure argon environment.

16. The method of claim 14, wherein the structure is annealed at a temperature of from about 1050° C. to about 1200° C.

17. The method of claim 14, wherein the structure is annealed for a period of from about 15 minutes to about 10 hours.

18. The method of claim 14, wherein the environment contains less than about 1 ppm of water vapor.

19. The method of claim 14, wherein the method reduces the Roughness Measurement System roughness of the surface of the structure to below about 0.2 nm as measured with scan sizes of about 1 μm×about 1 μm to about 30 μm×about 30 μm.

20. A method for processing a silicon-on-insulator structure comprising a handle wafer, a silicon layer, and a dielectric layer between the handle wafer and the silicon layer, the silicon layer having a cleaved surface defining an outer surface of the structure, the method comprising the steps of:

thermally annealing the structure in a pure argon environment at a temperature of at least about 950° C., wherein the environment contains less than about 10 ppm of oxygen; and performing a non-contact smoothing process on the cleaved surface.

* * * * *